(12) United States Patent
Doerr et al.

(10) Patent No.: US 8,810,245 B2
(45) Date of Patent: Aug. 19, 2014

(54) DEVICE FOR GENERATING OPPOSING FIELDS AND METHOD FOR OPERATING A MAGNETIC RESONANCE SCANNER

(75) Inventors: Thomas Doerr, Berlin (DE); Ingo Weiss, Berlin (DE)

(73) Assignee: Biotronik SE & Co. KG, Berlin (DE)

( * ) Notice: Subject to any disclaimer, the term of this patent is extended or adjusted under 35 U.S.C. 154(b) by 317 days.

(21) Appl. No.: 13/353,318

(22) Filed: Jan. 19, 2012

(65) Prior Publication Data

US 2012/0206142 A1 Aug. 16, 2012

Related U.S. Application Data

(60) Provisional application No. 61/441,288, filed on Feb. 10, 2011.

(51) Int. Cl.
*G01V 3/00* (2006.01)
*G01R 33/421* (2006.01)
*G01R 33/422* (2006.01)

(52) U.S. Cl.
CPC .......... *G01R 33/268* (2013.01); *G01R 33/4215* (2013.01); *G01R 33/422* (2013.01)
USPC .......................................... 324/309; 600/421

(58) Field of Classification Search
USPC ........... 324/309, 311, 314, 315; 600/420, 421
See application file for complete search history.

(56) References Cited

U.S. PATENT DOCUMENTS

| | | | |
|---|---|---|---|
| 7,164,950 B2 * | 1/2007 | Kroll et al. | 607/36 |
| 8,301,249 B2 * | 10/2012 | Min | 607/9 |
| 8,311,637 B2 * | 11/2012 | Ameri | 607/61 |
| 8,319,496 B2 * | 11/2012 | Eryaman et al. | 324/309 |
| 8,489,198 B2 * | 7/2013 | Cantatore et al. | 607/60 |
| 2004/0055652 A1 | 3/2004 | Erickson | |
| 2008/0023010 A1 | 1/2008 | Inman et al. | |
| 2008/0147154 A1 | 6/2008 | Gray et al. | |
| 2008/0269863 A1 | 10/2008 | Alexander et al. | |
| 2010/0237869 A1 | 9/2010 | Griswold et al. | |
| 2010/0253338 A1 | 10/2010 | Eryaman | |

FOREIGN PATENT DOCUMENTS

EP 1493460 1/2005

OTHER PUBLICATIONS

Marcin Ziolkowski et al. "Active, Passive and Dynamic Shielding of Static and Low Frequency Magnetic Fields", XV International Symposium on Theoretical Electrical Engineering, Jan. 1, 2009, pp. 370-374.
European Search Report, dated May 22, 2012, 5 pages.

* cited by examiner

*Primary Examiner* — Louis Arana
(74) *Attorney, Agent, or Firm* — ARC IP Law, PC; Joseph J. Mayo

(57) ABSTRACT

A device for generating opposing fields for shielding an implant in the body of a patient during a magnetic resonance imaging, which device comprises a field generation unit with one or more field generation configured to generate field pulses and a control unit coupled with the field generation unit, and which is configured in such a manner that field pulses can be generated as opposing fields through which, within a spatial zone which contains the implant at least in sections, high-frequency electromagnetic field pulses and/or magnetic gradient field pulses used during the magnetic resonance imaging can be reduced or cancelled out in their intensity through superposition.

18 Claims, 8 Drawing Sheets

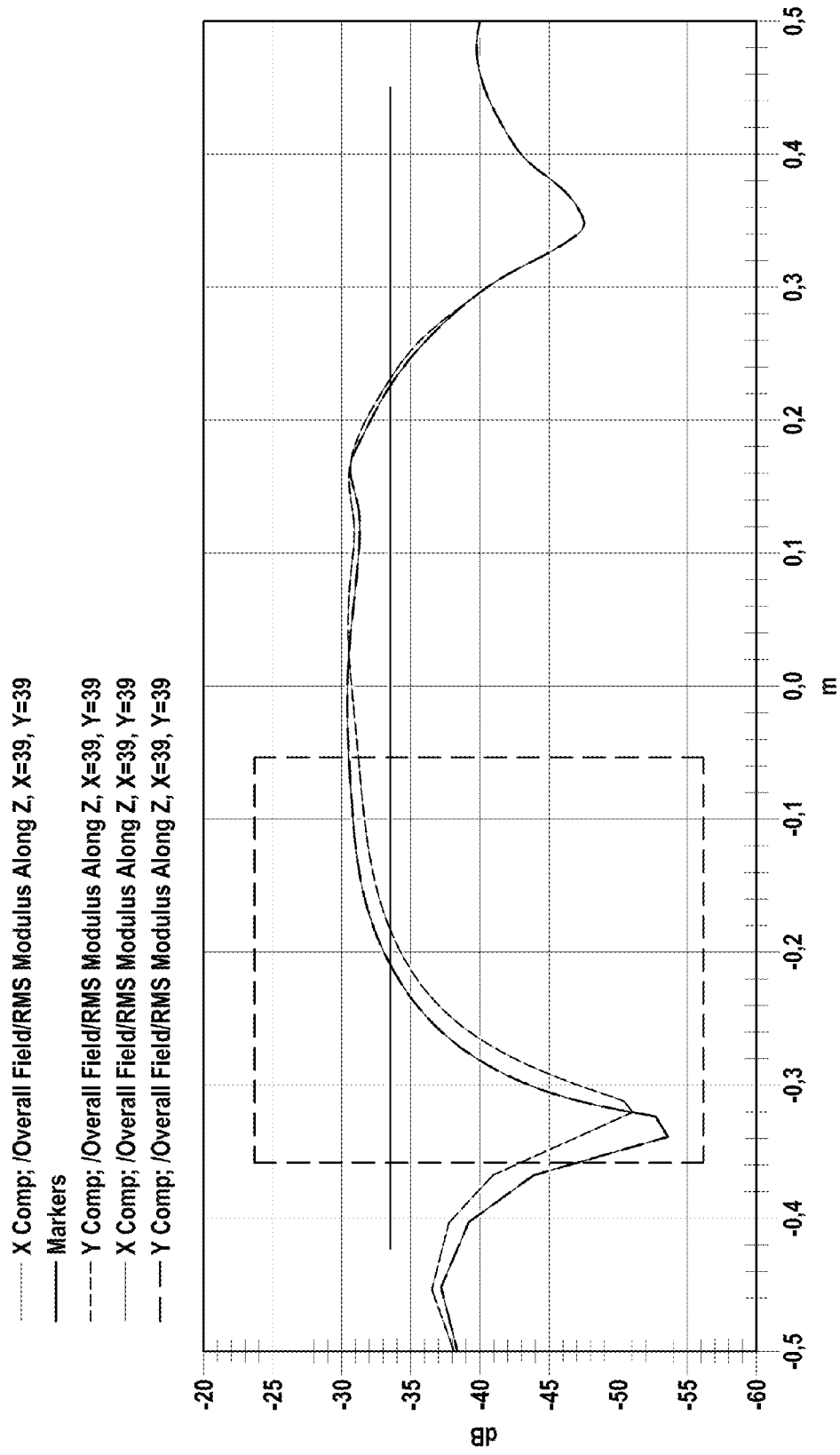

DEVICE FOR GENERATING OPPOSING FIELDS AND METHOD FOR OPERATING A MAGNETIC RESONANCE SCANNER

This application claims the benefit of U.S. Provisional Patent Application 61/441,288 filed on 10 Feb. 2011, the specification of which is hereby incorporated herein by reference.

BACKGROUND OF THE INVENTION

1. Field of the Invention

One or more embodiments of the invention concerns the field of medical technology and relates to a device for shielding an implant in the body of a person during a magnetic resonance imaging, and a method for operating a magnetic resonance scanner.

2. Description of the Related Art

During a nuclear or magnetic resonance imaging (MRI=Magnetic Resonance Imaging), atomic nuclei are forced by a strong static magnetic field ($B_0$ field) to perform a precision movement about the field direction and are excited into resonance during an excitation phase by high-frequency electromagnetic field pulses. After switching off the high-frequency pulses, the atomic nuclei go back again to their initial direction, wherein the decay times (relaxation times) are characteristic for different types of tissue. Simultaneously with the high-frequency pulses, fast switched magnetic gradient fields ($B_1$ field) are used through which it can be achieved that the magnetic field acting on the atomic nuclei varies, for example linearly, along a predetermined direction. This causes a change of the resonance frequency which allows a spatial allocation of individual MRI signals.

Today, MRI examinations are part of the daily routine in radiological diagnostics, wherein under normal examination conditions, except for occasional discomfort, there is no risk for the patients. However, more and more patients have implants consisting completely or partially of a metallic or conductive material which could cause problems during the examination or, in the worst case, could even injure the patients. The used material and the geometry of the implant as well as the position of the latter with respect to the MRI field pulses play a significant role here. Thus, some implants act as antenna for the irradiated MRI field pulses and heat up considerably due to the generated induction currents. Subsequently, thermal damage to the surrounding tissue can occur. In electronic implants, for example cardiac pacemakers, a malfunction, for example an incorrect sensing or an undesired restart with preset start parameters ("power-on reset") can be triggered.

For this reason, the diagnostic benefit of an MRI examination has to be carefully weighed against the risk of disadvantageous side effects. An additional difficulty is that the heating of some implants depends on the specific scan parameters and in particular on the positioning of the implants relative to the MRI field pulses so that in clinical practice very often no reliable prognoses about the expected consequences can be made. The result of all this is that persons with an implant are usually excluded from the normally gentle examination by means of MRI.

Recently, considerable efforts have been made to solve this problem. For example, new cardiac pacemaker systems were developed which are provided with specially designed pacemaker electrodes to counteract a heating by means of alternating fields. Likewise, specially designed cardiac pacemakers approved for an examination in a magnetic resonance scanner are commercially available. The disadvantage here is that these solutions involve additional costs and in some cases an impairment of the implant properties. Moreover, patients having implants not specifically suited for MRI examination cannot be examined by means of MRI.

BRIEF SUMMARY OF THE INVENTION

A feature of one or more embodiments of the invention is to enable patients having conventional implants that are not specifically approved for MRI to undergo a magnetic resonance imaging examination without any risk. This and further features are achieved according to embodiments of the invention that generate opposing fields and a method for operating a magnetic resonance scanner with the features as claimed.

According to one or more embodiments of the invention, a device for generating opposing fields is enabled herein. The device serves for shielding an implant in the body of a person, wherein the implant is at least partially made of a metallic or conductive material. Specifically, the device shields against field pulses (MRI field pulses) used during a magnet resonance imaging. Due to the shielding effect of the device according to one or more embodiments of the invention, an electromagnetic interference between the MRI field pulses and the implant can be reduced or prevented. As already explained above, during a magnet resonance imaging, electromagnetic high-frequency pulses for exciting the precisely moving atomic nuclei and fast switched magnetic gradient fields are used for the spatial allocation of the received MRI signals. In the meaning of one or more embodiments of the invention, the term "field pulses" is to be understood as pulsed (i.e. chronologically switched) high-frequency electromagnetic alternating fields and pulsed magnetic gradient fields. The high-frequency pulses usually involve fields, the frequency of which lies in a frequency range above 1 MHz. For example, protons can be excited in a static magnetic field of 1 Tesla with an electromagnetic alternating field having a frequency of approximately 42 MHz and in a static magnetic field of 1.5 Tesla with an electromagnetic alternating field having a frequency of approximately 63 MHz.

The device according to one or more embodiments of the invention for generating opposing fields serves for shielding implants, wherein implant wearers may include patients which undergo an MRI examination, and also medical-technical assistants and physicians who carry out an MRI examination and are potentially exposed to field pulses.

In the context of one or more embodiments of the invention, the term "implant" has a wide meaning. In a general manner, the term designates a device intended to remain permanently or temporarily in the body, which device can involve, for example, an electronic unit such as a cardiac pacemaker or cardioverter, an electrode such as a stimulation electrode, in particular for nerve stimulation, a cardiac pacemaker electrode, an ICD electrode, an electrophysiology catheter or an electrode for measuring brain potentials or any other type of device that resides within the body.

The device according to one or more embodiments of the invention for generating opposing fields comprises a field generation unit having one or more field generation element configured to generate opposing fields serving as field pulses. For this purpose, the field generation unit can be provided with a signal generator coupled with the field generation element that is configured to generate electrical signals. The field generation element can be configured, for example, in the form of antennas, in particular dipole field antennas, resonators, in particular birdcage resonators which can be configured, for example, as high-pass filter, low-pass filter or band-pass filter, and coils, in particular flat coils, Helmholtz coils, Maxwell coils, solenoids or saddle coils. The device according to one or more embodiments of the invention for generating opposing fields further comprises a control unit which is coupled with the field generation unit.

At least one embodiment of the device for generating opposing fields is configured in such a manner that field pulses can be generated as opposing fields through which, within a spatial zone which contains the implant at least in sections, high-frequency, electromagnetic field pulses and/or magnetic gradient field pulses used during the MR imaging can be reduced or cancelled out in their intensity by means of superposition. For this purpose, the control unit is suitably equipped with respect to the programming technology. "Shielding" within the meaning of the present invention thus is not to be understood as a passive shielding by an electrically conductive material (attenuation) but as an active shielding with energy consumption caused by superposition.

Here and hereinafter, the term "opposing field" is to be understood as a field which is suitable to cause at least an intensity reduction of an MRI field pulse by superposition, wherein phase opposition and amplitude equality are not mandatory. The field generation means can be fed by a signal generator, in particular with a downstream amplifier. In particular, the field generation means can also be controlled by the magnet resonance scanner itself. In this case, the control unit can be part of the magnet resonance scanner.

The device according to one or more embodiments of the invention for generating opposing fields thus allows in an advantageous manner a simple, cost-efficient MRI examination without any risk for the implant wearer and without the need for making special arrangements on the implants. Electromagnetic interferences between the field pulses and the implants can be reliably and safely prevented. In particular, by means of the device according to the invention it is possible for patients with conventional implants, in particular persons with a defective and/or deactivated electrode or probe, to undergo an MRI examination. Besides patients, the device according to one or more embodiments of the invention for generating opposing fields can also be used for the protection of medical personnel.

With the device for generating opposing fields, a shielding effect is to be achieved which is in any case strong enough that an impairment of the implant associated with a possible risk for the implant wearer is prevented. In particular, a possible malfunction of an electronic implant and the heating of an electrode are to be greatly reduced. Without being limited to this, the device for generating opposing fields can be configured in such a manner that the intensity of the MRI field pulses prior to the superposition with the opposing fields is less than 50%, in particular less than 40%, in particular less than 30%, in particular less than 20%, in particular less than 10%, in particular less than 5% and in particular less than 1%.

The device according to one or more embodiments of the invention can be configured in such a manner that field pulses are generated as opposing fields in such a manner that
a) exclusively the electromagnetic high-frequency pulses are reduced or cancelled out in their intensity while without opposing field, the magnetic gradient field pulses can freely pass to the implant;
b) exclusively the magnetic gradient field pulses are reduced or cancelled out in their intensity while without opposing field, the electromagnetic high-frequency pulses can freely pass to the implant;
c) the electromagnetic high-frequency pulses as well as the magnetic gradient field pulses each are reduced or cancelled out in their intensity.

In particular, the device according to one or more embodiments of the invention can be configured in such a manner that only the undesired (e.g. electrode-heating) high-frequency alternating fields are reduced or advantageously redistributed while with regard to a good imaging, the magnetic gradient fields are impaired as little as possible. This effect can be implemented, for example, via a control of amplitudes and phases of the field pulses serving as opposing fields. For the case that body regions which are not to be protected are exposed to a higher field load than without the use of the device according to one or more embodiments of the invention, the device can advantageously be configured in such a manner that permissible standard limits are not exceeded. This can be carried out in particular for the benefit of the body region which is to be protected (field redistribution).

In an advantageous embodiment of the device according to one or more embodiments of the invention for generating opposing fields, the same is configured in such a manner that the opposing fields generated as field pulses are optionally be adapted or can be adapted to the field pulses of a certain scanner type (magnetic resonance scanner) with respect to frequencies, amplitudes and phases. The opposing fields can in particular specifically be adapted to magnetic resonance scanners with static magnetic fields in the range from 1 to 7 Tesla. The device for generating opposing fields is then particularly effective for certain scanner types.

In a further advantageous embodiment of the device according to one or more embodiments of the invention for generating opposing fields, the same is configured in such a manner that the generated opposing fields are effective only for a certain frequency range, in particular a frequency range above 1 MHz. Thus, the device is transparent for the magnetic gradient field and does not distort the same. Therefore, an imaging can take place closer to the protected region (reduction of the image artifacts). Alternatively, it is possible that the generated opposing fields are effective only for a frequency range of maximum 1 MHz. Thus, the device is effective for the magnetic gradient fields and is transparent for the high-frequency electromagnetic alternating fields and does not distort the same.

In a further advantageous embodiment of the device according to one or more embodiments of the invention for generating opposing fields, the same is configured in such a manner that opposing fields are generated only during the excitation phase, i.e. during the phase of generating high-frequency pulses and magnetic gradient fields, in particular during the generation of the edges of the same, but not during the read-out phase of the image capture. By this measure, the exciting energy can be attenuated, for example, to minimize an electrode heating. On the other hand, the MRI signals sent back from the atomic nuclei can be acquired without reduction so that the image quality in particular in the shielded or protected body region is not impaired.

In a further advantageous embodiment of the device according to one or more embodiments of the invention for generating opposing fields, the same is configured in such a manner that it serves as link or connector between a conventional programmer which is typically arranged outside of the magnetic resonance scanner or a room in which the latter is located and the implant. For this purpose, the device is configured in such a manner that the signals for communicating with the implant are transmitted and received at a frequency which is different from the frequencies of the field pulses of an MR imaging. The signals can in particular be output by the field generation unit, wherein the at least one field generation means can serve as local programming head for the implant. In particular, optical and/or acoustic signals can also be used for a communication with the implant. Advantageously, the device is equipped in such a manner that a communication between link and implant takes place only in time periods in which no MRI field pulses are transmitted. Accordingly, a programming of the implant is in particular also possible in the pauses between the MRI field pulses used for imaging.

In a further advantageous embodiment of the device according to one or more embodiments of the invention for generating opposing fields, the same comprises one or more sensors for acquiring MRI field pulses used during the MR imaging and for generating corresponding sensor signals, wherein the device is equipped in such a manner that field pulses can be generated as opposing fields based on sensor signals. Thus, the opposing fields can be specifically generated with respect to locally applied MRI field pulses so that the implant can be shielded in a particularly effective manner. It can be advantageous if the sensor can be arranged within the spatial zone containing the implant so that the MRI field pulses applied in said zone can be detected. An adaptation of the generated opposing fields to the applied MRI field pulses is advantageously carried out in a control loop, wherein one or more sensors can be configured, for example, in such a manner that set values (in particular field compensation to zero) can be set. In particular, PLL circuits (PLL=Phase Locked Loop) can be used for this purpose.

In a further advantageous embodiment of the device according to one or more embodiments of the invention for generating opposing fields, the same is configured such that the field pulses generated as opposing fields allow a magnetic resonance imaging at a predetermined maximum distance from the body region (i.e. in the spatial zone containing the implant at least in sections) to be protected. Advantageously, an imaging is even possible at a distance of less than 3 cm from the body region to be protected.

In the device according to one or more embodiments of the invention for generating opposing fields it can further be of advantage if the generated opposing fields allow a magnetic resonance imaging also in the effective range of the device, i.e. in the body region to be protected. Preferably, an imaging is possible which extends at least up to 10 cm into the spatial zone containing the implant at least in sections. Furthermore, it can be of advantage that a reduced specific absorption rate (SAR value) caused by the use of the opposing fields has such a magnitude that a limited imaging is still possible.

In a further advantageous embodiment of the device according to one or more embodiments of the invention for generating opposing fields, the same is configured in such a manner that by the generated opposing fields only electronic components of the implant are protected. In this manner, the coupling in particular of the magnetic gradient fields into a programming coil and/or a transformer and/or conductor loop at the layout and/or other inductive, electrically conductive or magnetic components can be systematically reduced. For example, the spatial zone can be a ball with a radius of 10 cm (3 dB corner).

In a further advantageous embodiment of the device according to one or more embodiments of the invention for generating opposing fields, the field generation unit is configured as a construction of a plurality of antennas and/or coils, having conductive materials such as metal, conductive plastics, carbon fiber, etc. and combinations thereof.

In a further advantageous embodiment of the device according to one or more embodiments of the invention for generating opposing fields, at least the field generation unit is configured in such a manner that it can be arranged temporarily on the body or close to the body of the person. In particular, for this purpose, the device for generating opposing fields as such can also be configured in this manner. With this measure, a particularly effective shielding of the implant against the MRI field pulses can be achieved. In order to be able to temporarily attach the field generation unit or device for generating opposing fields on the body or close to the body of the person, the unit or device is advantageously configured in the form of a (e.g. closed) vest, trousers, trouser leg, soft collar, cap, face mask with openings for eyes and respiratory openings or as a part that can be wrapped around the body or a body part. In the form of a vest, it serves in particular for shielding an implant in the thoracic region, for example a cardiac pacemaker. As trousers or trouser leg, it serves in particular for shielding an elongated metallic vascular prosthesis or stent which often has a length of at least 200 mm. As cap or face mask, it serves in particular for shielding a so-called deep brain stimulator.

In particular, it can be of advantage here if the device for generating opposing fields or field generation unit is suitably configured for adapting to a contour of a body surface of the implant wearer. With this measure, on the one hand, a particularly good shielding of the implant against the MRI field pulses can be achieved. On the other, this increases the comfort for the implant wearer. For this purpose, the field generation unit or device for generating opposing fields can be made of flexible or bendable materials, for example.

Preferably, the field generation unit or device for generating opposing fields is configured in such a manner that a (shortest) distance from the body surface is at each position not greater than 5 cm, more preferably not greater than 3 cm and even more preferably not greater than 1 cm. With this measure, a particularly good shielding effect for the MRI field pulses can be achieved. In particular, the field generation unit or device for generating opposing fields can also be placed on a body surface adjacent to the implant.

For a use in the thoracic region it is preferred if the flexibility of the field generation unit or device for generating opposing fields is configured in such a manner that the respiration of the implant wearer is not significantly impaired. Moreover, the unit or device can at least partially include of a breathing material. On the other hand, the field generation unit or device for generating opposing fields can be filled with a gaseous and/or liquid fluid for adaptation to the contour of the body surface of the implant wearer. The liquid fluid can in particular involve a gel.

For an attachment on the body, the field generation unit or device for generating opposing fields can be provided, for example, with closures such as velcro closures. Also, it is conceivable to provide it with one or more adhesive points so that it can be adhered onto the body surface for fixation. In general, the field generation unit or device for generating opposing fields can be provided for a single use or for multiple uses. As a single-use item, it can in particular be formed to be adhesive.

The device for generating opposing fields acts in a shielding manner against the high-frequency electromagnetic alternating fields and the fast-switched magnetic gradient fields used in magnetic resonance imaging. In an advantageous embodiment of the device according to one or more embodiments of the invention, said device or the field generation unit has a relative magnetic permeability of maximum 100, in particular of maximum 4, in particular of maximum 1. The relative magnetic permeability, for example, can lie in the range 4 to 100. It can be of advantage here if the field generation unit or device for generating opposing fields includes substantially only of paramagnetic and/or diamagnetic materials or magnetically neutral materials. With this measure, it can be achieved that it is transparent for the strong static magnetic fields and magnetic gradient fields used in the MRI examination so as to avoid a distortion of said fields for artifact reduction.

The device for generating opposing fields, in particular the field generation unit for generating the field pulses can heat up due to the induction currents generated by the MRI field pulses. Preferably, the device for generating opposing fields has a cooling unit for actively or passively cooling said device. With this measure, on the one hand, the comfort for the implant wearer can be improved in an advantageous manner. On the other, the time period of the MRI examination and, optionally, the intensity of the MRI field pulses can be increased. The cooling unit can in particular be configured as device for active ventilation. For the purpose of an active cooling it is also conceivable to use Peltier elements which are based on the Peltier effect and which, depending on the polarity of the applied voltage, can produce or dissipate heat. A passive cooling can be achieved, for example, by cold packs.

In a further advantageous embodiment of the device according to the invention for generating opposing fields, the device is provided with a communication unit for communicating with an electronic implant. In this manner, information can be transmitted to the implant, in particular with respect to an upcoming MR imaging. The implant, for example, is programmed or can be programmed in such a manner that it switches to an operating mode which is specifically adapted to the conditions of an MR imaging in order to prevent malfunctions.

Preferably, the device for generating opposing fields has a self-sufficient energy supply which can be implemented in the form of means for generating and optionally storing energy from MRI field pulses. In particular, said device can be set up in such a manner that the communication unit is supplied with energy from the MRI field pulses so that the device only works when a MRI examination is being carried out. Thus, the activity of the communication unit is controlled by energy of the field pulses, wherein the implant only switches to a particular operating mode if the MR imaging actually takes place and is continuously kept running by continuing the sequence of images. On the other hand, in absence of activity of the communication unit, the implant receives the information that the MR imaging is finished and the implant thus can switch again to the normal operating mode. In particular, the device for generating opposing fields can be exclusively supplied with energy from the MRI field pulses.

In a further advantageous embodiment of the device for generating opposing fields, said device has a marking unit for marking the shielded spatial zone in a magnetic resonance image. With this measure, an automatic image correction or artifact limitation can take place in an advantageous manner in order to improve the quality of imaging in this manner. The marking unit can be configured in particular as RFID transponder (RFID=Radio-Frequency Identification) that allows an automatic identification and marking by means of electromagnetic waves.

In a further advantageous embodiment of the device according to one or more embodiments of the invention for generating opposing fields, said device or only the field generation unit is configured in such a manner that the thickness (dimension perpendicular to a body surface of the implant wearer) of the same changes due to the influence of a mechanical force, for example the weight of a person, only insignificantly, if at all. Preferably, a thickness change of less than 20% takes place. For this purpose, the device for generating opposing fields or field generation unit can be provided, for example, with a honey comb structure.

In a further advantageous embodiment of the device according to one or more embodiments of the invention for generating opposing fields, an edge region (border) of the device or an edge region of the field generation unit is configured in such a manner that excessive heating of the body tissue is prevented by a locally increased specific absorption rate (SAR). This can be achieved, for example, in that the shielding efficiency for MRI field pulses, for example, decreases gradually towards the edge and/or that a (shortest) distance from the body surface increases towards the edge. With this measure, the comfort for the implant wearer can be improved. On the other hand, the time period of the examination and, optionally, the intensity of the MRI field pulses can be increased.

In a further advantageous embodiment of the device according to one or more embodiments of the invention for generating opposing fields, an edge region (border) of the device or an edge region of the field generation unit is configured in such a manner that the wave impedance in particular of the high-frequency MRI field pulses changes from the non-shielded body tissue towards the shielded region only insignificantly. Preferably, the wave impedance changes by less than 20%, particularly preferably by less than 10% and more preferably by less than 5%. Particularly preferred, a transformation or adaptation of the wave impedance to the shielded region takes place within the first 2 to 5 cm extending from the edge region (border) of the device for generating opposing fields or field generation unit. With this measure, the quality of the imaging can be improved in an advantageous manner.

In a further advantageous embodiment of the device according to one or more embodiments of the invention for generating opposing fields, said device, in particular the field generation unit, is provided with electrode surfaces for the use in the thoracic region, which electrode surfaces can be brought in contact with the body surface. Said electrode surfaces can in particular be used for defibrillation. Preferably, the electrode surfaces are connected to leads in such a manner that the electrode surfaces can be controlled by an external defibrillator without prior removal of the device for generating opposing fields, in particular of the field generation unit. This means that, for example in case of a vest-shaped device for generating opposing fields or field generation unit, connections or contact surfaces for connecting the defibrillator can be arranged in an advantageous manner on the outside of the vest.

In a further advantageous embodiment of the device according to one or more embodiments of the invention for generating opposing fields, said device, in particular the field generation unit, is configured such that it can be galvanically and/or capacitively coupled with the body surface. Such a coupling can take place, for example, via an electrically conductive gel. In particular, it can be galvanically isolated and, at the same time, capacitively coupled. In case of an areally capacitive coupling it can be of advantage if the capacitance is greater than 1 pF/m² coupling area.

In a further advantageous configuration of the device according to one or more embodiments of the invention, the field generation unit and/or the at least one field generation means is formed cylindrically and is arranged coaxially to a field coil of the magnetic resonance scanner.

The invention further relates to a method for operating a magnetic resonance scanner in which field pulses are generated by a device for generating opposing fields which comprises a field generation unit with at least one field generation configured to generate field pulses. The opposing fields are configured such that, in a spatial zone containing, at least in sections, an implant in the body of a person, electromagnetic high-frequency pulses and/or magnetic gradient field pulses used during MR imaging can be reduced or cancelled out in their intensity by superposition. It can be of advantage here if field pulses used during magnetic resonance imaging are detected by at least one sensor and field pulses are generated as opposing fields based on sensor signals.

In a particularly advantageous embodiment of the method according to one or more embodiments of the invention, the device for generating opposing fields, in particular the field generation unit for generating field pulses serving as opposing fields, can be attached on the body or close to the body of a person.

In a further advantageous embodiment of the method according to one or more embodiments of the invention, field pulses are generated as opposing fields only during an excitation phase of the magnetic resonance imaging in which atomic nuclei are excited into resonance and thus are not generated during a read-out phase in which the atomic nuclei relax. Thus, the exciting energy is shielded in order not to influence the implant; however, subsequently, the energy is released in order not to reduce the MRI signal sent back from the atom nuclei and thus not to unnecessarily affect the image quality in particular in the shielded body region.

In a further advantageous embodiment of the method according to one or more embodiments of the invention, the intensity of MRI field pulses is reduced such that magnetic resonance imaging in the zone containing the implant is possible at least in some regions.

In a further advantageous embodiment of the method according to one or more embodiments of the invention, prior to and/or during a magnetic resonance imaging, the implant is put into a specifically adapted operating mode.

In an advantageous embodiment of the method according to one or more embodiments of the invention, the device for generating opposing fields, in particular the field generation unit, is cooled at least temporarily prior to and/or during a MR imaging.

In a further advantageous embodiment of the method according to one or more embodiments of the invention, scan parameters for MR imaging such as intensity, frequency and scan region are adapted when the implant is shielded from the MRI pulses so that an optimized imaging is made possible.

In a further advantageous embodiment of the method according to one or more embodiments of the invention, the generation of field pulses as opposing fields for the MRI field pulses is controlled by the magnetic resonance scanner.

In a further advantageous embodiment of the method according to one or more embodiments of the invention, field pulses are generated as opposing fields in such a manner that
a) exclusively the electromagnetic high-frequency pulses are reduced or cancelled out in their intensity while without opposing field, the magnetic gradient field pulses can freely pass to the implant;
b) exclusively the magnetic gradient field pulses are reduced or cancelled out in their intensity while without opposing field, the electromagnetic high-frequency pulses can freely pass to the implant;
c) the electromagnetic high-frequency pulses as well as the magnetic gradient field pulses each are reduced or cancelled out in their intensity.

In a further advantageous embodiment of the method according to one or more embodiments of the invention, field pulses are generated as opposing fields of MRI field pulses in such a manner that magnetic resonance imaging is also possible in the effective range of the opposing fields.

In further advantageous embodiments of the method according to one or more embodiments of the invention, field pulses are generated as opposing fields in such a manner that they are effective only in a frequency range above 1 MHz or, alternatively, are effective in a frequency range of maximum 1 MHz.

The invention further relates to the use of a device according to one or more embodiments of the invention for generating opposing fields for shielding an implant that at least partially includes a metallic or electrically conductive material in the body of a person during magnetic resonance imaging.

It is to be understood that the different embodiments and configurations of the subject matters according to one or more embodiments of the invention can be implemented individually or in any combination. In particular, the features mentioned above and yet to be described hereinafter can be used not only in the described combinations but also in other combinations or alone without departing from the context of the present invention.

BRIEF DESCRIPTION OF THE DRAWINGS

The invention is now illustrated in more detail by means of exemplary embodiments, wherein reference is made to the attached drawings. Identical or identically acting elements are designated with the same reference numbers. In the figures:

FIG. 10 shows the exemplary curve of the B1 field during an MRI examination with and without device for generating opposing fields.

DETAILED DESCRIPTION OF THE INVENTION

Figure 1:
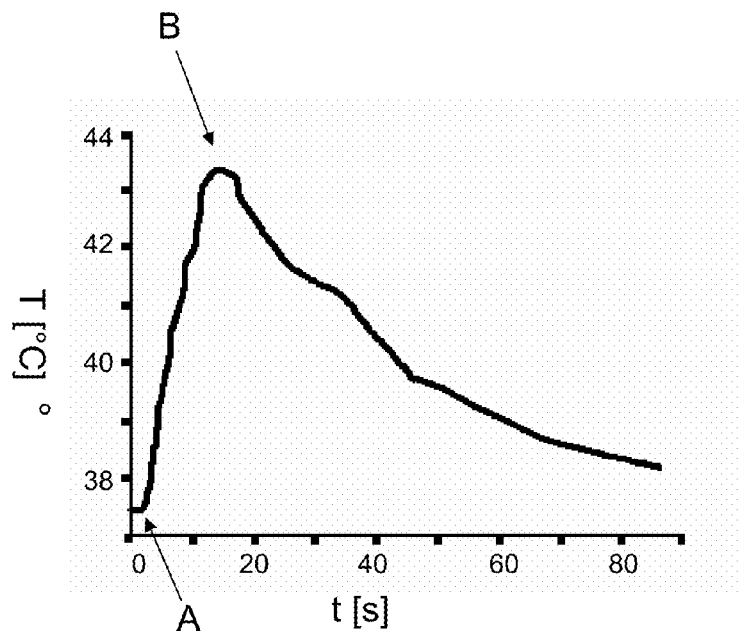
FIG. 1 shows a typical temperature curve of the electrode tip of an implanted electrode during an MRI examination.

First shown is FIG. 1, where a typical temperature curve of the electrode tip of an implanted conventional pacemaker/ICD electrode during an MRI examination is illustrated by means of a diagram. The time (t) in seconds is plotted as abscissa and the temperature T in ° C. is plotted as ordinate. The reason for the temperature increase is an electromagnetic interference (generation of induction currents) between the MRI field pulses and the electrode.

Accordingly, the temperature of the electrode tip increases rapidly when switching on the high-frequency alternating field at the time A, wherein the steepness of the temperature increase and the maximum achievable temperature strongly depends on the spatial position of the electrode with respect to the alternating field. In the example shown, the temperature rises above 43° C. After switching off the alternating field at the time B, the electrode tip cools down relatively fast due to the relatively low heat capacity. Due to the high temperature the electrode tip has reached, a thermal damage to the surrounding tissue cannot be ruled out.

Figure 2A:
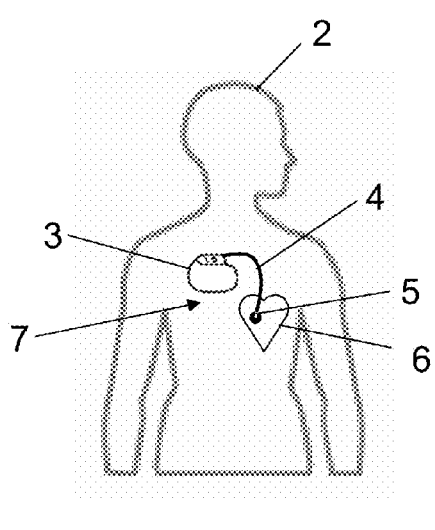
FIG. 2A-2B show schematic illustrations of a patient with an implant without device for generating opposing fields (FIG. 2A) and with an exemplary device for generating opposing fields (FIG. 2B)
Figure 2B:
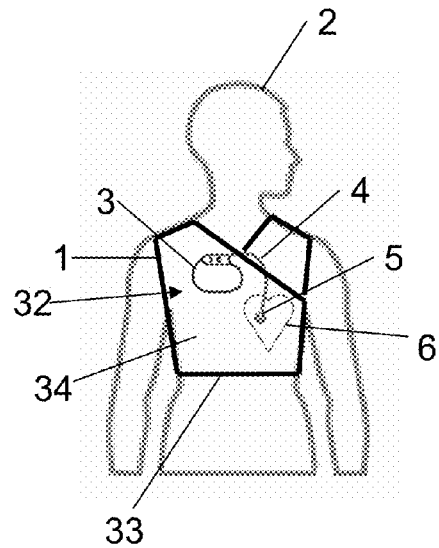

FIGS. 2A and 2B show schematic illustrations of a patient 2 with an electronic implant which is configured here, for example, as pacemaker 3. FIG. 2A shows the patient 2 without the device 1 according to at least one embodiment of the invention for generating opposing fields and FIG. 2B shows the patient 2 with attached device 1 for generating opposing fields. The pacemaker 3 is connected via an electrode line 4 to the heart 6 of the patient. For this purpose, the electrode line 4 has a distal section which, for example, passes the right atrium and is positioned with a distal end or electrode tip 5 within the right ventricle. Electrode surfaces in the region of the electrode tip 5 which are not shown in detail can be used for scanning and or simulation purposes (antibradycardiac stimulation). The pacemaker 3 can detect electrical signals of the heart 6 and can output electrical impulses to trigger contractions as needed. Instead of a pacemaker 3, likewise, for example an ICD (cardioverter/defibrillator) could be implanted. This involves an electronic apparatus which can generate shock impulses, for example to stop life-threading ventricular fibrillations.

During an MRI examination, especially in case of the small-area electrode tip 5 and without appropriate counter measures, there is the risk of heating due to the generation of induction currents by the used high-frequency alternating fields with the possible consequence of damage to the surrounding tissue. The electromagnetic interference can result in some cases to an increase of the stimulation threshold and an impairment of the perceptual function (faulty sensing or oversensing) of the pacemaker 3. It cannot be ruled out here that the pacemaker 3 carries out the wrong therapy or a therapy is inhibited.

These undesired consequences can be prevented by the device 1 for generating opposing fields shown in FIG. 2B. Here, the device 1 is configured, for example, in the form of a vest which, as a wrappable part, can be applied in a simple and safe manner in the region of the thorax 7 of the patient 2 for the duration of the MRI examination. The device 1 for generating opposing fields covers the region of the implanted pacemaker 3 and the associated electrode line 4 completely and all around the patient 2 and shields the implanted components in a spatial zone 32 containing said components. An attachment of the device 1 for generating opposing fields on the patient 2 can be carried out, for example, by a velcro closure which is not illustrated in detail. Alternatively, it is likewise possible that the device 1 for generating opposing fields is configured, for example, as a type of bandage or as an adhesive, disposable item. By the device 1 for generating opposing fields, the pacemaker 3 and the electrode line 4 can be shielded to a significant extent or completely from the MRI field pulses used during the MRI examination.

Figure 7:
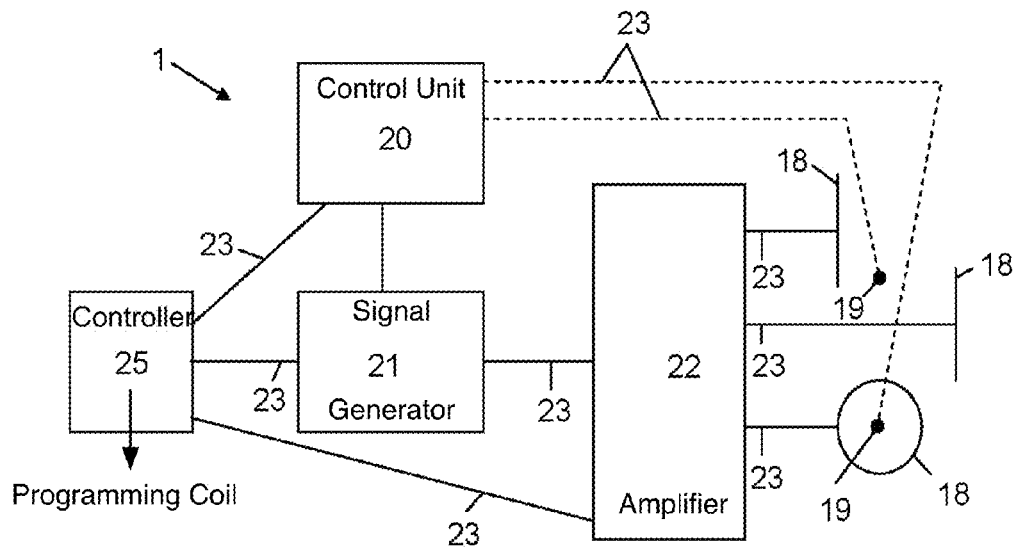
FIG. 7 shows a schematic illustration of the structure of an exemplary device for generating opposing fields.

As illustrated in FIG. 7, the device 1 for generating opposing fields comprises for this purpose a field generation unit 10 collectively designated with the reference number 10 which is provided with a plurality of field generation means 18 for generating electromagnetic alternating fields which are configured here, for example, as antennas. Sensors 19 serve for detecting the MRI field pulses in proximity of the pacemaker 3 to be shielded and the electrode line 4. A control unit 20 for controlling the device 1 for generating opposing fields is connected in a data-processing manner via electrical lines 23 to the sensors 19 and, with interposition of a signal generator 21 and an amplifier 22, to the field generation means 18. Thus, based on sensor signals of the sensors 19 which are read-out and processed, the device 1 can generate antenna signals by means of the signal generator 21, which antenna signals are amplified by the amplifier 22 (with driver and matching network) and transmitted to the field generation means 18 for generating electromagnetic alternating fields. A controller 25 connected in a data-processing manner to the control unit 20, the signal generator 21 and the amplifier 22 serves for externally controlling the device 1.

As illustrated in FIG. 2B, the device 1 for generating opposing fields is configured, for example, in the form of a vest attached on the thorax 7, wherein the vest can be adapted in a simple manner to the contour of the body surface of the patient 2. The device 1 has a relative magnetic permeability of maximum 100, in particular maximum 4, in particular maximum 1 so that it is transparent for the strong static magnetic fields used in the MRI examination and—if no active shielding takes place—transparent for the magnetic gradient fields used for this purpose. An edge region 33 of the device 1 for generating opposing fields is configured such that a wave impedance of the particularly high-frequency MRI field pulses from the non-shielded body tissue towards the shielded region changes only insignificantly. Moreover, the device 1 is set up in such a manner that the edge region 33, with respect to an inner region 34 arranged within the edge region, has a reduced intensity decrease of field pulses used during the magnetic resonance imaging.

By the device 1, field pulses can be generated which serve as opposing fields for the active (energy-consuming) compensation of the MRI field pulses used during the magnetic resonance imaging and thus protect the pacemaker 3 and the electrode line 4. The pacemaker 3 and the electrode line 4 thus are at least approximately field-free or the adjacent fields do not cause a damaging effect for pacemaker 3 and patient 2. Advantageously, opposing fields are generated only during an excitation phase so that the electromagnetic alternating fields emitted during a read-out phase by the relaxing atomic nuclei can be detected from the magnetic resonance scanner for imaging without impairment by the opposing fields. Furthermore, it is of advantage if the device 1 has a (non-illustrated) cooling unit for active or passive cooling of the device so as to improve the patient comfort and to avoid an excessive heating during long-lasting MRI examinations. A passive cooling can be achieved, for example, by cold packs.

Figure 3:
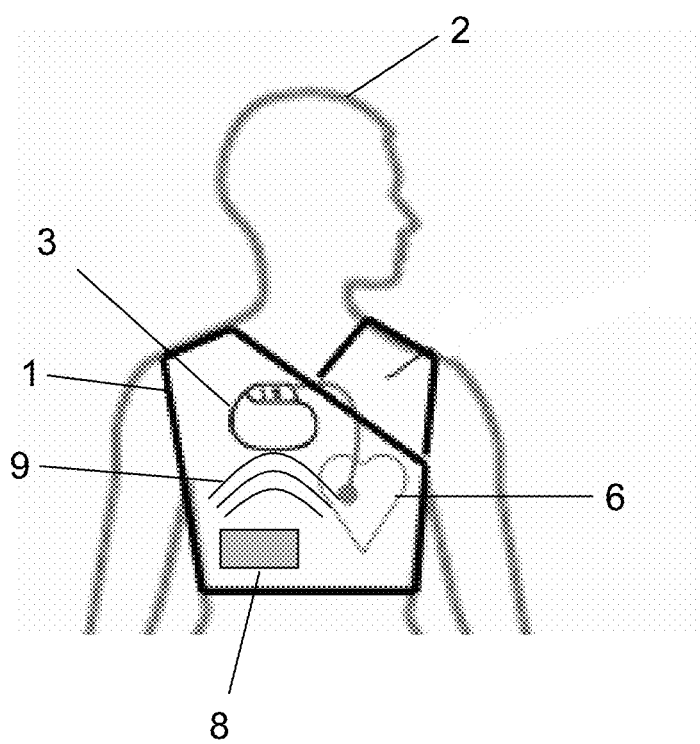
FIG. 3 shows a schematic illustration of a patient with implant for visualizing a further exemplary device for generating opposing fields.

FIG. 3 shows a variant in which the device 1 for generating opposing fields configured as vest is provided with a communication unit 8. The communication unit 8 is able to wirelessly send an electrical signal 9 to pacemaker 3, wherein in this manner, the information can be transmitted that the device 1 is in use and an MRI examination is carried out. The pacemaker 3 can be programmed, for example, in such a manner that it subsequently switches to an MRI operating mode which is specifically adapted to the MRI examination for preventing malfunctions. For this purpose, the communication unit 8 is configured to identify a static magnetic field and/or gradient field and/or electromagnetic high-frequency field and configured to generate and transmit the signals 9 which preferably have a coding which is identifiable by the pacemaker 3 in order to put the latter preferably temporarily into the MRI operating mode. The communication unit 8 can obtain the needed energy, for example, from the fields used during the MRI examination, wherein for this purpose, the communication unit has means for energy generation and intermediate storage of energy (e.g. capacitor, accumulator) which are not illustrated in detail. The activity of the communication unit 8 thus is controlled exclusively by external energy, wherein in absence of activity of the communication unit 8, the pacemaker 3 receives the information that the imaging or the generation of high-frequency alternating fields is completed and thus can switch again to the normal operating mode. Alternatively, it would also be possible that the communication unit 8 is supplied by its own energy storage device (battery). In particular, an antenna of the field generation element 18 can be used for communication with the pacemaker 3 and the device 1.

Figure 4A:
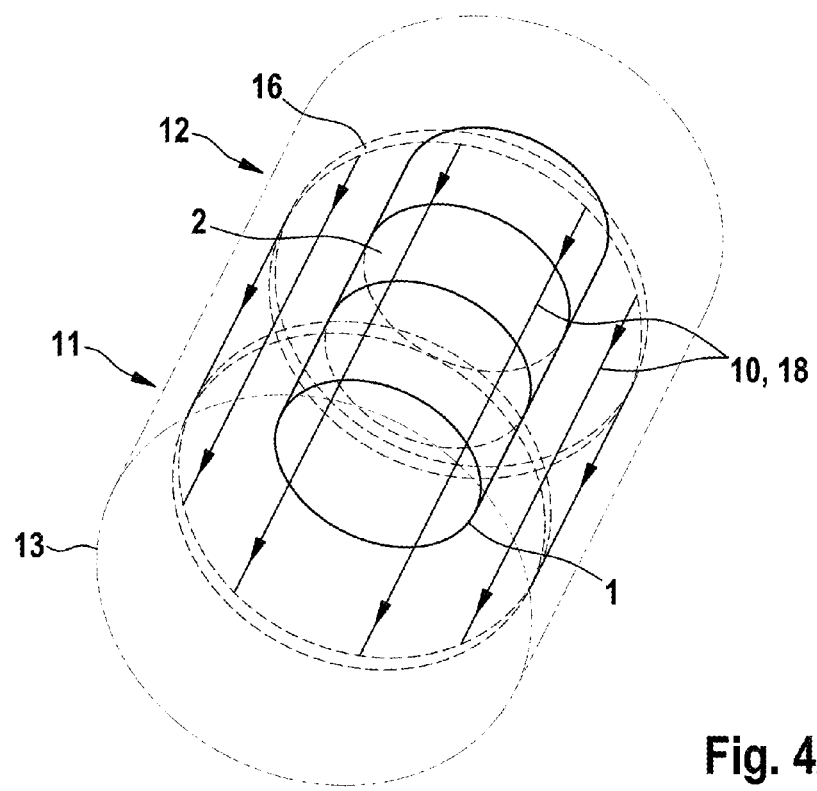
FIG. 4A-4B show schematic illustrations for visualizing an exemplary shielding arrangement.
Figure 4B:
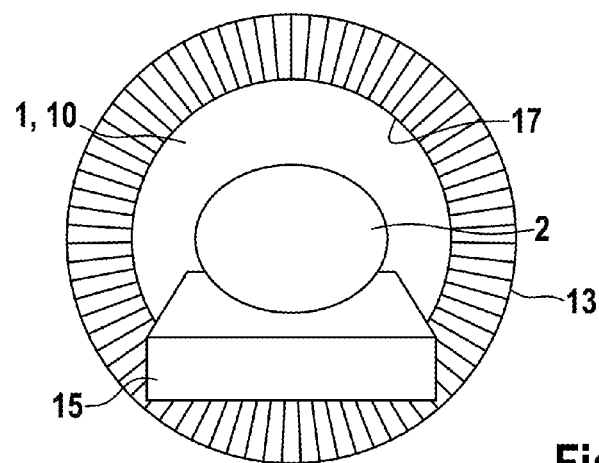

The FIGS. 4A and 4B illustrate a further exemplary embodiment of the invention in a schematic manner. FIG. 4A shows a (transparent) perspective illustration; FIG. 4B shows a vertical section through FIG. 4A. Accordingly, a shielding arrangement, which is collectively designated with the reference number 11, comprises a magnet resonance scanner 12 with a receiving tube or cylindrical patient tube 13 in which a schematically illustrated patient 2 is to be placed on a patient couch for the examination. One or more embodiments of the invention include a cylindrical high-frequency resonator 16, by which an electromagnetic alternating field can be generated for the MRI examination. For this purpose, the cylindrical patient tube 13 serves for shielding the alternating fields from the outside. On the body of the patient 2, a device 1 configured to generate opposing fields is arranged which, as in the previously described exemplary embodiments, can be configured, for example, as vest for shielding an implant in the thoracic region. In particular, it can comprise an arrangement of field generation means 18 which are configured as antennas and which are arranged in the surroundings of the body region to be protected, in particular all around the body. Due to the spatially displaceable (height-adjustable) patient couch 15, (e.g. air bed), the patient 2 can optionally be brought in a desired position within the cylindrical patient tube 13, for example centered within the device 1. In the field generating unit 10, the antennas are arranged along a cylindrical contour which, for example, is arranged here coaxially to the high-frequency resonator 16, whereby a particularly good shielding effect can be achieved.

Figure 5B:
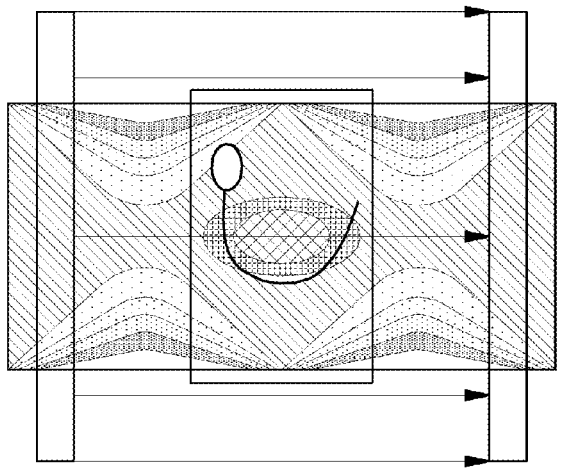
FIG. 5A-5B show computational simulations for visualizing the effect of the device for generating opposing fields.
Figure 5A:
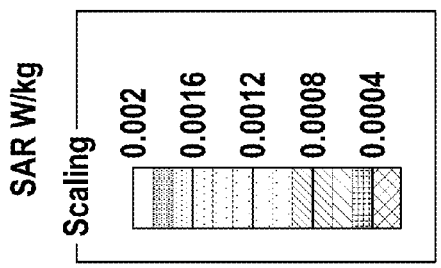
Figure 5A:
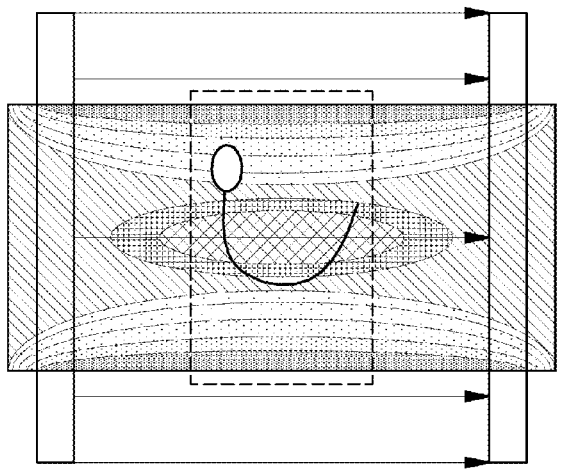

For a situation as shown in the FIGS. 4A and 4B, the FIGS. 5A and 5B illustrate a distribution of the energy density in W/kg (SAR=specific absorption rate) generated during the MRI examination in the body of the patient 2 in the region of the electrode line 4, wherein FIG. 5A shows the situation without device 1 for generating opposing fields, and FIG. 5B shows the situation with device 1. These situations are based on a computational simulation, wherein the patient 2 lies centrally within the scanner or cylindrical patient tube 13 (worst case scenario). These images show clearly which energy densities exist in the immediate vicinity of the electrode line 4 and which advantageous effect can be achieved here by the device 1 for generating opposing fields.

Figure 6B:
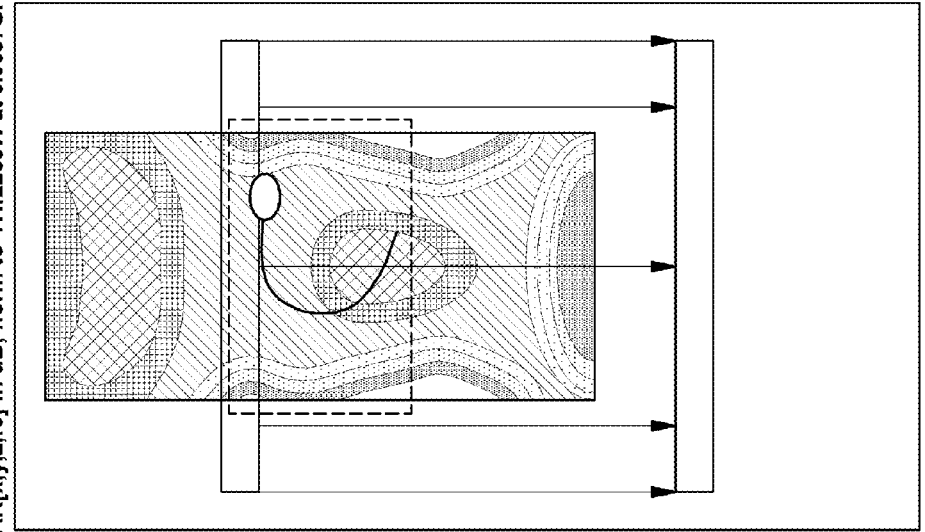
FIG. 6A-6B show further computational simulations for visualizing the effect of the device for generating opposing fields.
Figure 6A:
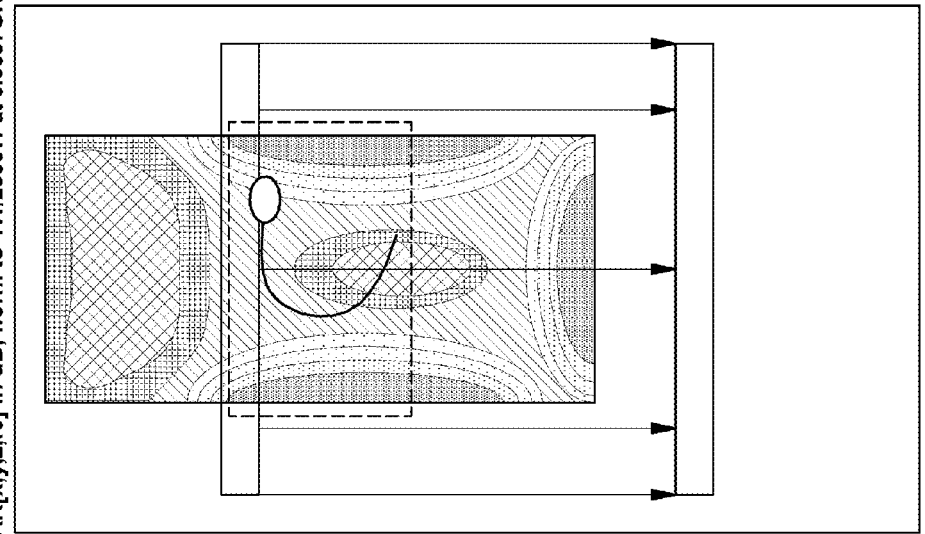

For a situation as shown in the FIGS. 4A and 4B, the FIGS. 6A and 6B illustrate a distribution of the energy density in W/kg (SAR=specific absorption rate) generated during the MRI examination in the body of the patient 2 in the region of the electrode line 4, wherein FIG. 6A shows the situation without device 1 and FIG. 6B shows the situation with device 1. These situations are based on a computational simulation, wherein the patient 2 lies decentrally within the scanner or cylindrical patient tube 13 (abdomen scan). These images too show clearly which energy densities exist in the immediate vicinity of the electrode line 4 and which advantageous effect can be achieved here by the device 1.

Figure 8:
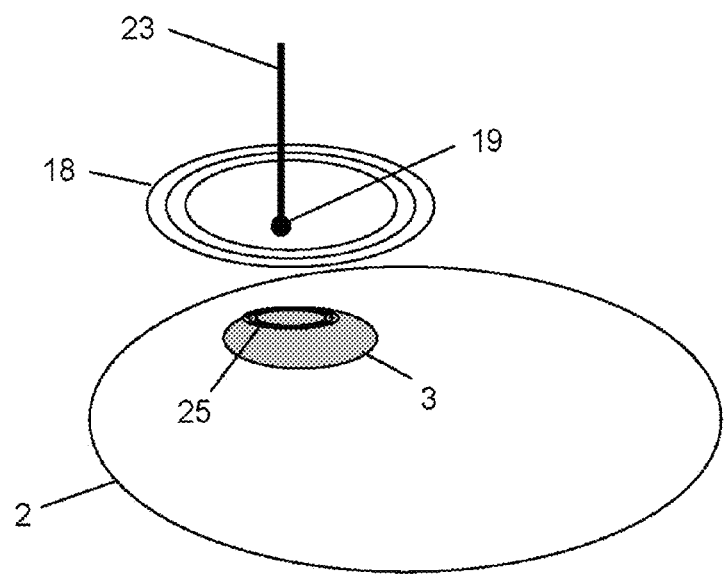
FIG. 8 shows a schematic illustration for visualizing the prevention of electromagnetic interference of an MRI field pulse with a programming coil of an implant.

FIG. 8 illustrates the prevention of electromagnetic interference between an MRI field pulse and a programming coil 25 of the pacemaker 3 in the body of the patient 2. The programming coil 25 is particularly sensitive to the generation of induction currents by magnetic gradient fields. The field generation means 18 which is configured as coil or antenna generates a field counteracting the interference field, wherein said field is being optimized until the sensor 19 indicates a minimum for the total field at this position. An optimization of the counter field can take place via a variation of amplitude, phase, frequency, switching-on/switching-off times and edge steepness.

Figure 9:
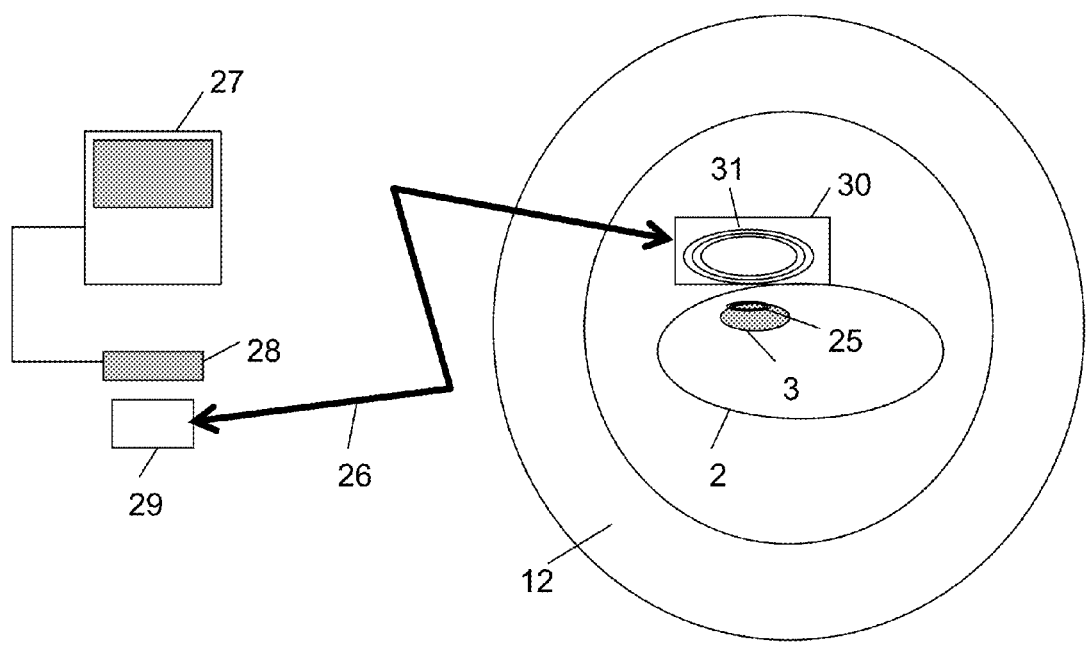
FIG. 9 shows a schematic illustration for visualizing the use of the device for generating opposing fields as link between a programmer and an electronic implant.

FIG. 9 illustrates the use of the device 1 for generating opposing fields as link between a programmer 27 (arranged outside of the magnet resonance scanner 12) for programming the pacemaker 3 and the pacemaker 3. According to this, the programmer 27 comprises a programming head 28 and a first transducer 29 which is connected via a preferably bidirectional data line 26 to a second transducer 30 of the device 1 configured to generate opposing fields. The second transducer 30 is provided with an antenna 31 for communication with the programming coil 25 of the pacemaker 3. The antenna 31 can involve in particular a field generation element 18, i.e. an antenna for generating opposing fields. The data line 26 can allow a wireline or wireless communication. A communication between the programmer 27 and the pacemaker 3 preferably takes place on frequencies which do not affect an MR imaging. The communication can take place in particular by optical and/or acoustic signaling. By using the device 1 for generating opposing fields as link, a programming of the pacemaker 3 can be carried out during an MRI examination.

FIG. 10 illustrates the imaging possibilities when using the device 1 according to one or more embodiments of the invention for generating opposing fields during an MRI examination. The location is indicated in meter (m) and plotted as abscissa and the field strength level dB of the x- and y-components of the $B_1$ field are plotted as ordinate. Curve I illustrates a situation without shielding device and curve II a situation with shielding device. Above the curve II, the field strength of the $B_1$ field is sufficient for imaging. The dashed line indicates the region of shielding. According to this, the $B_1$ field remains circularly polarized even in the case of an opposing field effect, i.e., the x- and y-components are equally strong, and is only attenuated locally. Only the field of view (FOV=field of view) is slightly impaired. From this it can be concluded that with the device 1 for generating opposing fields, an imaging even up to the inside of the protected region is possible.

As is illustrated in detail by means of the exemplary embodiments, the invention allows a simple, cost-effective MRI examination which is risk-free for the patient, without the need that special measures have to be taken on the implant. In particular, even patients already having an implant can undergo an MRI examination, wherein no special settings at the magnetic resonance scanner are required. A particular advantage is the possibility to shield defective or deactivated probes and long stents such as vascular prostheses.

It will be apparent to those skilled in the art that numerous modifications and variations of the described examples and embodiments are possible in light of the above teaching. The disclosed examples and embodiments are presented for purposes of illustration only. Other alternate embodiments may include some or all of the features disclosed herein. Therefore, it is the intent to cover all such modifications and alternate embodiments as may come within the true scope of this invention.

REFERENCE NUMBER LIST

1 Device for generating opposing fields
2 Patient
3 Pacemaker
4 Electrode line
5 Electrode tip
6 Heart
7 Thorax
8 Communication unit
9 Signal
10 Field generation unit
11 Shielding arrangement
12 Magnetic resonance scanner
13 Cylindrical patient tube
14 Room
15 Patient couch
16 High-frequency resonator
17 Inner wall
18 Field generation means
19 Sensors
20 Control unit
21 Signal generator
22 Amplifier
23 Line
24 Controller
25 Programming coil
26 Data line
27 Programmer
28 Programming head
29 First transducer
30 Second transducer
31 Antenna
32 Zone
33 Edge region
34 Inner region

What is claimed is:

1. A device for generating opposing fields for shielding an implant in the body of a patient during a magnetic resonance imaging comprising:
    a field generation unit comprising one or more field generation elements configured to generate field pulses;
    a control unit coupled with the field generation unit, and which is configured to control said field generation unit to generate said field pulses as opposing fields through which, within a spatial zone which contains an implant located within a body of a patient, at least in sections, high-frequency electromagnetic field pulses and/or magnetic gradient field pulses that occur during a magnetic resonance imaging are reduced or cancelled out in their respective intensity through superposition; and,
    a marking unit configured to mark the spatial zone that contains the implant in a magnetic resonance image.

2. The device according to claim 1, further comprising:
    one or more sensors configured to detect said high-frequency electromagnetic field pulses and/or said magnetic gradient field pulses that occur during the magnetic resonance imaging and further configured to generate corresponding sensor signals, wherein said control unit is further configured to control said field generation unit to generate said opposing fields based on said sensor signals.

3. The device according to claim 1, wherein the field generation unit is configured to be arranged temporarily on the body or close to the body of the patient.

4. The device according to claim 3, wherein at least the field generation unit is configured to adapt to a contour of a body surface of the patient.

5. The device according to claim 1, wherein at least the field generation unit is galvanically and/or capacitively coupled with the body of the patient.

6. The device according to claim 1, further comprising a communication unit configured to communicate with the implant.

7. The device according to claim 1, further comprising an energy generation unit configured to generate energy from said high-frequency electromagnetic field pulses and/or said magnetic gradient field pulses that occur during the magnetic resonance imaging.

8. The device according to claim 1, wherein said field generation unit comprises an inner region and an edge region wherein said inner region is arranged within said edge region and wherein said edge region has a reduced intensity decrease of the high-frequency electromagnetic field pulses and/or said magnetic gradient field pulses that occur during the magnetic resonance imaging.

9. The device according to claim 1, wherein said marking unit comprises a Radio-Frequency Identification (RFID) transponder.

10. The device according to claim 9, wherein said RFID transponder is configured to allow automatic identification and marking of said implant using electromagnetic waves.

11. A method for operating a magnetic resonance scanner comprising:
    generating field pulses using a field generation unit comprising one or more field generation elements;
    controlling said field generation elements with a control unit coupled with the field generation unit in generating said field pulses as opposing fields through which, within a spatial zone which contains an implant located within a body of a patient, at least in sections, high-frequency electromagnetic field pulses and/or magnetic gradient field pulses that occur during a magnetic resonance imaging are reduced or cancelled out in their respective intensity through superposition; and,
    marking the spatial zone that contains the implant in a magnetic resonance image with a marking unit.

12. The method according to claim 11, further comprising attaching the field generation unit on the body or close to the body of the patient.

13. The method according to claim 11, further comprising detecting said high-frequency electromagnetic field pulses and/or said magnetic gradient field pulses that occur during the magnetic resonance imaging by at least one sensor as sensor signals and wherein said controlling said field generation elements further comprises controlling said field generation elements in generating said field pulses as said opposing fields based on said sensor signals.

14. The method according to claim 11, wherein said controlling said field generation elements further comprises controlling said field generation elements in generating said opposing fields so that said high-frequency electromagnetic field pulses and/or said magnetic gradient field pulses that occur during the magnetic resonance imaging are reduced or cancelled out in their intensity during an excitation phase of the magnetic resonance imaging and are reduced in their intensity at least to a lesser extent during a read-out phase of the magnetic resonance imaging.

15. The method according to claim 11, further comprising reducing the intensity of the high-frequency electromagnetic field pulses and/or the magnetic gradient field pulses that occur during the magnetic resonance imaging so that the magnetic resonance imaging in the spatial zone containing the implant is possible at least in sections.

16. The method according to claim 11, further comprising placing the implant into a specifically adapted operating mode prior and/or during the magnetic resonance imaging.

17. The device according to claim 11, wherein said marking unit comprises a Radio-Frequency Identification (RFID) transponder.

18. The device according to claim 17, wherein said RFID transponder is configured to allow automatic identification and marking of said implant using electromagnetic waves.

* * * * *